(12) United States Patent
Kawai

(10) Patent No.: US 6,892,338 B2
(45) Date of Patent: May 10, 2005

(54) ANALOG/DIGITAL CHARACTERISTICS TESTING DEVICE AND IC TESTING APPARATUS

(75) Inventor: Teruyoshi Kawai, Hamamatsu (JP)

(73) Assignee: Yokogawa Electric Corporation, Tokyo (JP)

(*) Notice: Subject to any disclaimer, the term of this patent is extended or adjusted under 35 U.S.C. 154(b) by 517 days.

(21) Appl. No.: 09/977,301

(22) Filed: Oct. 16, 2001

(65) Prior Publication Data
US 2002/0049942 A1 Apr. 25, 2002

(30) Foreign Application Priority Data
Oct. 24, 2000 (JP) ........................................ 2000-324216

(51) Int. Cl.[7] .............................................. G01R 31/28
(52) U.S. Cl. ...................................... 714/740; 324/765
(58) Field of Search ............................. 714/740, 724; 324/765

(56) References Cited

U.S. PATENT DOCUMENTS

| | | | | | |
|---|---|---|---|---|---|
| 4,216,539 A | * | 8/1980 | Raymond et al. | ........... | 714/734 |
| 6,331,770 B1 | * | 12/2001 | Sugamori | ................ | 324/158.1 |
| 6,378,093 B1 | * | 4/2002 | Whetsel | ...................... | 714/726 |
| 6,449,741 B1 | * | 9/2002 | Organ et al. | ................ | 714/724 |
| 6,536,006 B1 | * | 3/2003 | Sugamori | ................... | 714/724 |
| 6,671,844 B1 | * | 12/2003 | Krech et al. | ................ | 714/736 |
| 6,690,189 B2 | * | 2/2004 | Mori et al. | ................. | 324/765 |

* cited by examiner

Primary Examiner—Albert Decady
Assistant Examiner—John P. Trimmings
(74) Attorney, Agent, or Firm—Oliff & Berridge, PLC (57) ABSTRACT

An analog/digital characteristics testing device comprises: a plurality of measurement circuits for measuring an analog/digital characteristic of one or more ICs to be tested in accordance with a test condition data; and a setting unit for setting a different test condition data to each measurement circuit.

6 Claims, 8 Drawing Sheets

| COUNTER VALUE | IN1 | IN2 | IN3 | IN4 | ~ | INn | OUT1 | OUT2 | OUT3 | OUT4 | ~ | OUTn |
|---|---|---|---|---|---|---|---|---|---|---|---|---|
| 1 | TEST RESULT a | TEST RESULT b | TEST RESULT c | TEST RESULT d | ~ | TEST RESULT n | TEST RESULT a | TEST RESULT b | TEST RESULT c | TEST RESULT d | — | TEST RESULT n |
| 2 | TEST RESULT a | TEST RESULT b | — | — | — | — | TEST RESULT a TEST RESULT b | — | — | — | — | — |
| 3 | TEST RESULT a | TEST RESULT b | TEST RESULT c | — | — | — | TEST RESULT a TEST RESULT b TEST RESULT c | — | — | — | — | — |
| 4 | TEST RESULT a | TEST RESULT b | TEST RESULT c | TEST RESULT d | — | — | TEST RESULT a TEST RESULT b TEST RESULT c TEST RESULT d | — | — | — | — | — |
| ~ | ~ | ~ | ~ | ~ | ~ | ~ | ~ | ~ | ~ | ~ | ~ | ~ |
| n | TEST RESULT a | TEST RESULT b | TEST RESULT c | TEST RESULT d | ~ | TEST RESULT n | TEST RESULT a TEST RESULT b TEST RESULT c TEST RESULT d ~ TEST RESULT n | ~ | ~ | ~ | ~ | ~ |

| COUNTER VALUE | IN1 | IN2 | IN3 | IN4 | OUT1 | OUT2 | OUT3 | OUT4 |
|---|---|---|---|---|---|---|---|---|
| 1 | TEST RESULT a | TEST RESULT b | TEST RESULT c | TEST RESULT d | TEST RESULT a | TEST RESULT b | TEST RESULT c | TEST RESULT d |
| 2 | TEST RESULT a | TEST RESULT b | TEST RESULT c | TEST RESULT d | TEST RESULT a TEST RESULT b | TEST RESULT c TEST RESULT d | — | — |
| 3 | TEST RESULT a | TEST RESULT b | TEST RESULT c | TEST RESULT d | TEST RESULT a TEST RESULT b TEST RESULT c | — | — | — |
| 4 | TEST RESULT a | TEST RESULT b | TEST RESULT c | TEST RESULT d | TEST RESULT a TEST RESULT b TEST RESULT c TEST RESULT d | — | — | — |

RELATED ART FIG.8

ANALOG/DIGITAL CHARACTERISTICS TESTING DEVICE AND IC TESTING APPARATUS

BACKGROUND OF THE INVENTION

1. Field of the Invention

The present invention relates to an analog/digital characteristics testing device. In detail, the present invention relates to an analog/digital characteristics testing device for testing the analog/digital characteristics of an IC to be tested. Further, the present invention relates to an IC testing apparatus having a function of testing the analog/digital characteristics of an IC to be tested.

2. Description of Related Art

According to an earlier development, there is an IC testing apparatus (hereinafter, referred to as "IC tester") comprising an analog/digital characteristics testing device for testing the analog/digital characteristics of an IC to be tested (hereinafter, referred to as "DUT").

In this specification, the analog/digital characteristic(s) test means, for example, the test for the characteristic(s) of an analog-to-digital converter, the test for the characteristic(s) of a digital-to-analog converter or the like.

Figure 8:
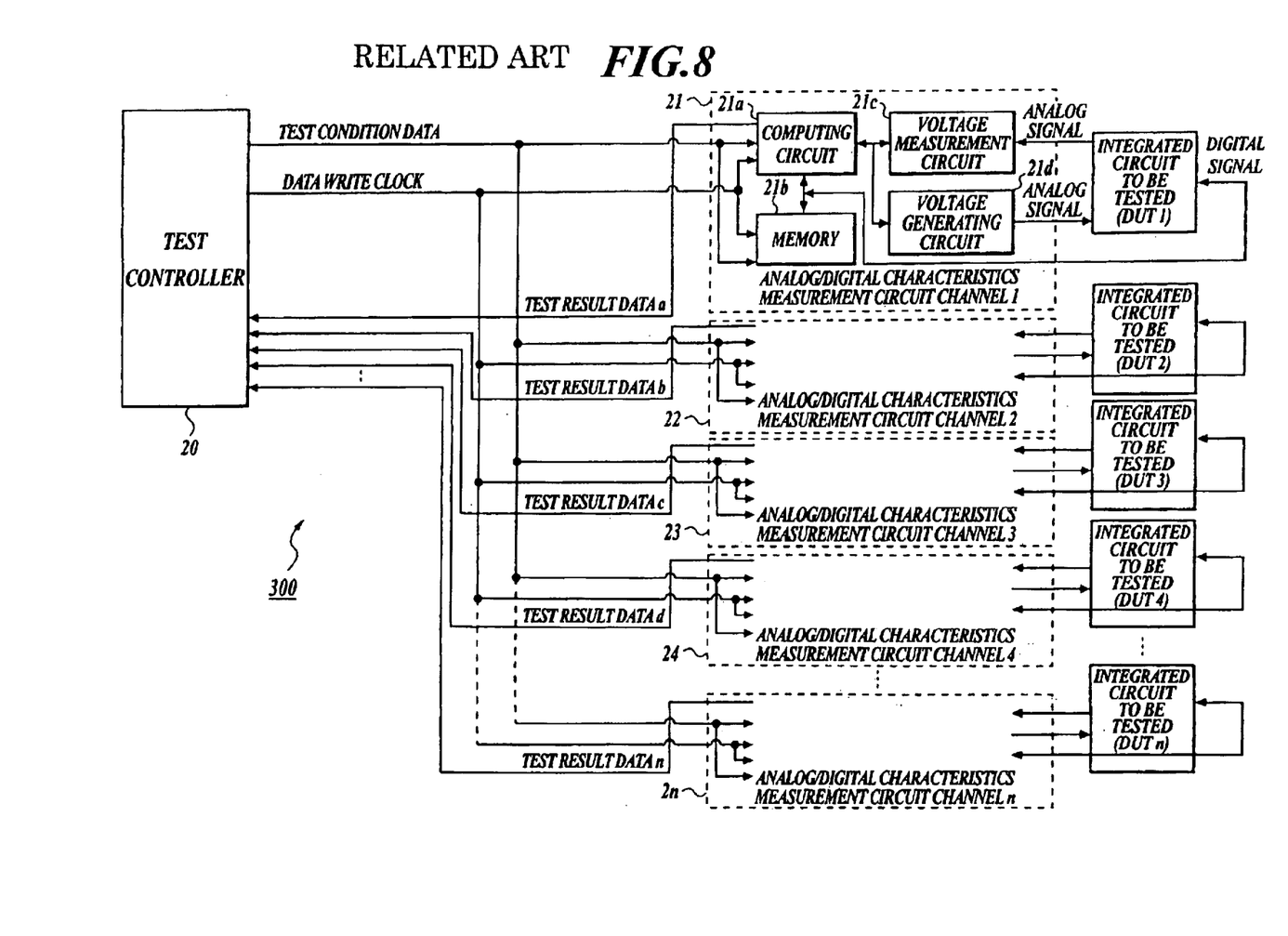
FIG. 8 shows a block diagram of the analog/digital characteristics testing device according to an earlier development.

An analog/digital characteristics testing device according to an earlier development, is shown in FIG. 8.

As shown in FIG. 8, the analog/digital characteristics testing device 300 comprises a test controller 20, a plurality of analog/digital characteristics measurement circuits 21, 22, 23, 24, ..., 2n. The n integrated circuits to be tested (DUT1 to DUTn) are connected with the analog/digital characteristics measurement circuits 21, 22, 23, 24, ..., 2n, respectively.

The test controller 20 outputs a test condition data for the analog/digital characteristics test and a data write clock signal for writing the test condition data in the analog/digital characteristics measurement circuits 21 to 2n. Further, the test controller 20 manages a test result data outputted from each analog/digital characteristics measurement circuit 21 to 2n.

Each analog/digital characteristics measurement circuit 21 to 2n comprises a computing circuit 21a, a memory 21b, a voltage measurement circuit 21c and a voltage generating circuit 21d.

The test condition data outputted from the test controller 20 is stored in the memory 21b at a timing of the data write clock signal. Further, in the memory 21b, a measurement algorithm for measuring the analog/digital characteristics is previously stored.

In case that an object to be tested for the analog/digital characteristics is an analog-to-digital converter of the DUT, the computing circuit 21a controls the voltage generating circuit 21d to apply an analog signal to the analog-to-digital converter of the DUT by the voltage generating circuit 21d.

The DUT outputs a digital signal corresponding to the applied analog signal. The computing circuit 21a stores the digital signal in the memory 21b. The computing circuit 21a controls the voltage generating circuit 21d to change the analog signal to be applied, and collects the necessary data for the analog/digital characteristics measurement.

When the necessary data is collected, the computing circuit 21a computes a data to judge whether the DUT is good or poor in accordance with the test condition data. The computing circuit 21a outputs the above judgment as a test result to the test controller 20.

In case that an object to be tested for the analog/digital characteristics is a digital-to-analog converter of the DUT, the computing circuit 21a applies a digital signal to the digital-to-analog converter of the DUT. The digital-to-analog converter outputs an analog signal corresponding to the applied digital signal. A voltage of the outputted analog signal is measured by the voltage measurement circuit 21c.

The computing circuit 21a stores a measurement value obtained by the voltage measurement circuit 21c, in the memory 21b. The computing circuit 21a changes a digital signal to be applied, and collects the necessary data for the analog/digital characteristics measurement.

When the necessary data is collected, the computing circuit 21a computes a data to judge whether the DUT is good or poor in accordance with the test condition data. The computing circuit 21a outputs the above judgment as a test result to the test controller 20.

The analog/digital characteristics measurement circuits 22, 23, 24, ..., 2n have the same structure and function as the analog/digital characteristics measurement circuit 21.

As explained above, the analog/digital characteristics testing device 300 according to an earlier development can comprise a plurality of analog/digital characteristics measurement circuits. However, because the analog/digital characteristics measurement circuit requires a voltage generating circuit and a voltage measurement circuit which are high precise and costly elements, the number of the analog/digital characteristics measurement circuits to be provided is the same as that of the DUTs which can be simultaneously measured by an IC tester, or is less than that of the DUTs, generally.

In case that a plurality of the analog/digital characteristics measurement circuits are provided in the analog/digital characteristics testing device, a plurality of DUTs are simultaneously measured by writing the same test condition data therein at the same timing with the data write clock signal. On the other hand, in case that a plurality of circuits to be tested for the analog/digital characteristics, which have different characteristics from each other, such as a plurality of analog-to-digital converters or digital-to-analog converters, are provided in one DUT, the analog/digital characteristics of these circuits cannot be simultaneously measured. That is, when a plurality of circuits to be tested for the analog/digital characteristics, which have different characteristics from each other, are provided in one DUT, it is necessary that a different test condition data should be written in each analog/digital characteristics measurement circuit in order to test the analog/digital characteristics of each circuit to be tested.

In general, because the DUT in which a plurality of circuits to be tested for the analog/digital characteristics, are provided, has a large scale, a number of pins for the logic function test are required. Therefore, the number of the DUTs which can be simultaneously measured by the IC tester, becomes small. When the analog/digital characteristics test for such a DUT is carried out, a plurality of analog/digital characteristics measurement circuits which are provided in the analog/digital characteristics testing device, are not effectively used.

SUMMARY OF THE INVENTION

In order to solve the above-described problems, an object of the present invention is to improve the efficiency of the analog/digital characteristics test and to suppress the manufacturing cost of the analog/digital characteristics testing device.

That is, in accordance with the first aspect of the present invention, an analog/digital characteristics testing device comprises:
- a plurality of measurement circuits for measuring an analog/digital characteristic of one or more ICs to be tested in accordance with a test condition data; and
- a setting unit for setting a different test condition data to each measurement circuit.

According to the first aspect of the present invention, because the analog/digital characteristic of an IC to be tested can be tested by setting different test condition data to a plurality of measurement circuits with the setting unit, the efficiency of the test is improved. For example, even though the circuits to be tested, such as a plurality of analog-to-digital converters, a plurality of digital-to-analog converters or the like, are provided in one IC to be tested, the analog/digital characteristic test can be carried out by setting different test condition data to each circuit to be tested.

The setting unit may comprise:
- a test condition outputting circuit for outputting the test condition data in order;
- a counting circuit for counting the number of the test condition data outputted from the test condition outputting circuit; and
- a specifying circuit for specifying the measurement circuit in which the test condition data is written, in accordance with a counter value of the counting circuit.

The number of the test condition data outputted in order is counted by the test condition outputting circuit, the counting circuit and the specifying circuit. Therefore, the test condition data to be set and the measurement circuit in which the test condition data is written, can be specified in accordance with the counter value, that is, the output order.

When an initial test condition data is outputted from the test condition outputting circuit, the specifying circuit may specify all of the measurement circuits as a circuit in which the initial test condition data is written.

When the test condition data is one, a plurality of IC to be tested can be simultaneously tested by setting the same test condition data to all of the measurement circuits.

The analog/digital characteristics testing device may further comprise a management unit for managing a test result data obtained by each measurement circuit.

The result of the analog/digital characteristic test can be easily managed by the managing unit.

The management unit may comprise:
- multiplexing circuit for outputting the test result data obtained by each measurement circuit, from a predetermined output terminal in accordance with a counter value of the counting circuit; and
- a judging circuit for judging whether the one or more ICs to be tested are good or poor in accordance with the test result data outputted from the multiplexing circuit.

Because it can be judged whether the one or more ICs to be tested is good or poor by the multiplexing circuit and the judging circuit in accordance with the test result data outputted from each measurement circuit, a test operator can easily obtain the test result data under various test conditions.

In accordance with the second aspect of the present invention, an analog/digital characteristics testing device comprises:
- a test condition outputting circuit for outputting one or more test condition data;
- a plurality of measurement circuits for measuring an analog/digital characteristic of one or more ICs to be tested in accordance with the test condition data; and
- a setting unit for setting the test condition data to each measurement circuit;

wherein when the test condition outputting circuit outputs one test condition data, the setting unit sets the outputted one test condition data to all of the measurement circuits; and when the test condition outputting circuit outputs a plurality of test condition data, the setting unit selects one test condition data to be set to each measurement circuit, from the plurality of test condition data.

The setting unit may comprise a counting circuit for counting the number of the test condition data outputted from the test condition outputting circuit;

wherein the setting unit sets the test condition data to each measurement circuit in accordance with the number of test condition data, which is counted by the counting circuit.

The analog/digital characteristics testing device may further comprise a multiplexing circuit for multiplexing a plurality of test result data obtained by measuring the analog/digital characteristic of the one or more ICs to be tested with the plurality of measurement circuits.

In accordance with the third aspect of the present invention, an IC testing apparatus comprises:
- an analog/digital characteristics testing device comprising: a plurality of measurement circuits for measuring an analog/digital characteristic of one or more ICs to be tested in accordance with a test condition data; and a setting unit for setting a different test condition data to each measurement circuit.

The setting unit may comprise:
- a test condition outputting circuit for outputting the test condition data in order;
- a counting circuit for counting the number of the test condition data outputted from the test condition outputting circuit; and
- a specifying circuit for specifying the measurement circuit in which the test condition data is written, in accordance with a counter value of the counting circuit.

When an initial test condition data is outputted from the test condition outputting circuit, the specifying circuit may specify all of the measurement circuits as a circuit in which the initial test condition data is written.

The analog/digital characteristics testing device may further comprise a management unit for managing a test result data obtained by each measurement circuit.

The setting unit may comprise:
- a test condition outputting circuit for outputting the test condition data in order; and
- a counting circuit for counting the number of the test condition data outputted from the test condition outputting circuit; and the management unit may comprise:
- a multiplexing circuit for outputting the test result data obtained by each measurement circuit, from a predetermined output terminal in accordance with a counter value of the counting circuit; and
- a judging circuit for judging whether the one or more ICs to be tested are good or poor in accordance with the test result data outputted from the multiplexing circuit.

In accordance with the fourth aspect of the present invention, an IC testing apparatus comprises:
- an analog/digital characteristics testing device comprising: a test condition outputting circuit for outputting one or more test condition data; a plurality of measurement circuits for measuring an analog/digital characteristic of one or more ICs to be tested in accordance with the test condition data; and a setting unit for setting the test condition data to each measurement circuit;

wherein when the test condition outputting circuit outputs one test condition data, the setting unit sets the outputted one test condition data to all of the measurement circuits; and when the test condition outputting circuit outputs a plurality of test condition data, the setting unit selects one test condition data to be set to each measurement circuit, from the plurality of test condition data.

The setting unit may comprise a counting circuit for counting the number of the test condition data outputted from the test condition outputting circuit;

wherein the setting unit sets the test condition data to each measurement circuit in accordance with the number of test condition data, which is counted by the counting circuit.

The analog/digital characteristics testing device may further comprise a multiplexing circuit for multiplexing a plurality of test result data obtained by measuring the analog/digital characteristic of the one or more ICs to be tested with the plurality of measurement circuits.

BRIEF DESCRIPTION OF THE DRAWINGS

The present invention will become more fully understood from the detailed description given herein below and the accompanying drawings which are given by way of illustration only, and thus are not intended as a definition of the limits of the present invention, and wherein.

PREFERRED EMBODIMENT OF THE INVENTION

Hereinafter, the analog/digital characteristics testing device according to the present invention will be explained in detail with reference to the drawings.
First Embodiment:

The structure of the analog/digital characteristics testing device according to the first embodiment will be explained.

Figure 1:
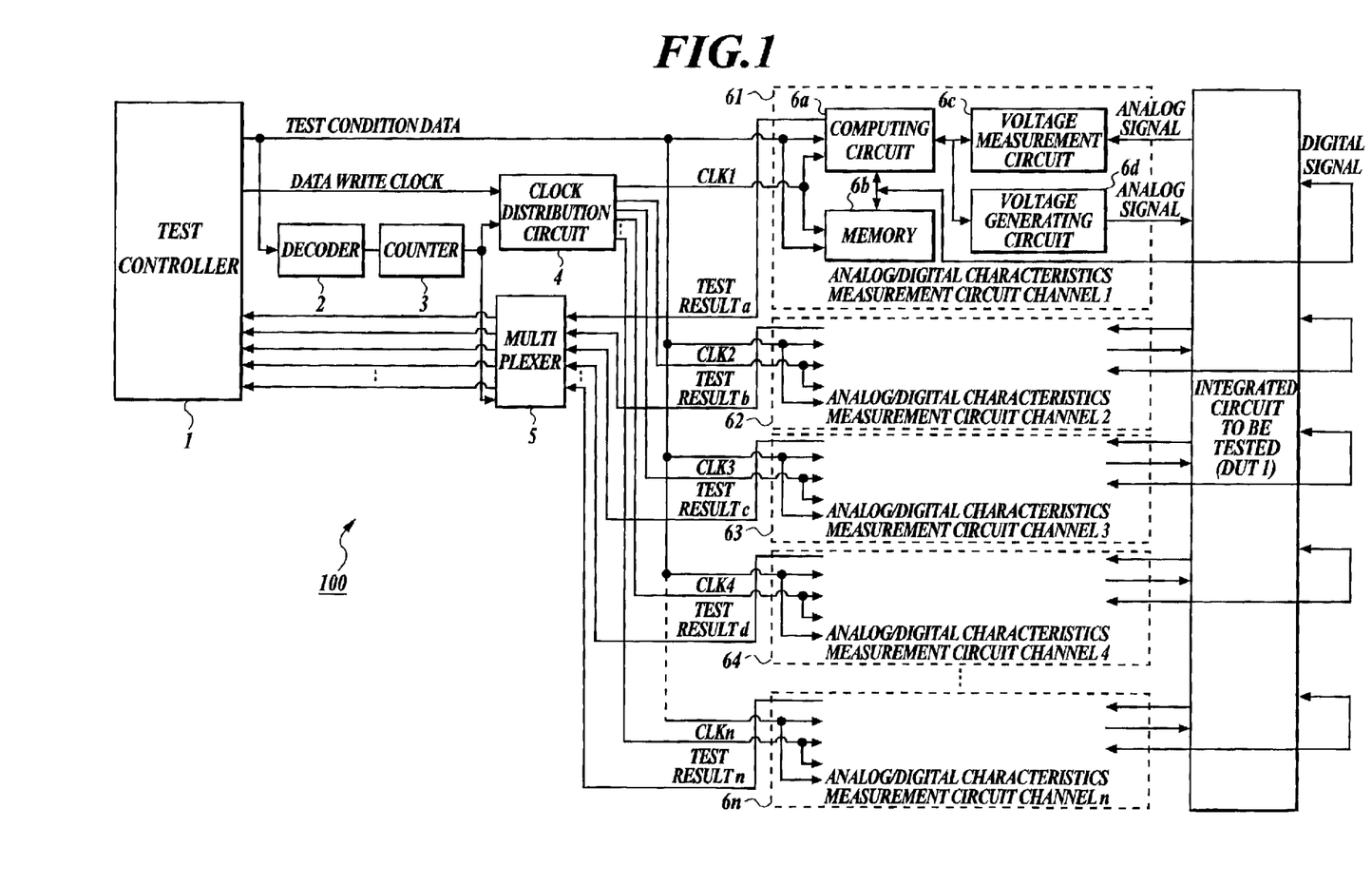
FIG. 1 shows a block diagram of the analog/digital characteristics testing device according to the first embodiment.

FIG. 1 shows a block diagram of the analog/digital characteristics testing device 100.

As shown in FIG. 1, the analog/digital characteristics testing device 100 comprises a test controller 1, a decoder 2, a counter 3, a clock distribution circuit 4, a multiplexer 5 and a plurality of analog/digital characteristics measurement circuits 61, 62, 63, 64, . . . , 6n. In the following explanation, each analog/digital characteristics measurement circuit 61, 62, 63, 64, . . . , 6n is generally referred to as "analog/digital characteristics measurement circuit 6" when the analog/digital characteristics measurement circuits are not required to be distinguished from each other.

The test controller 1 stores a test program for testing the analog/digital characteristics of an IC to be tested (hereinafter, referred to as "DUT"). The test controller 1 outputs a test condition data in accordance with the test program and outputs a data write clock signal for writing the test condition data in the first to nth analog/digital characteristics measurement circuits 6.

Figure 2:
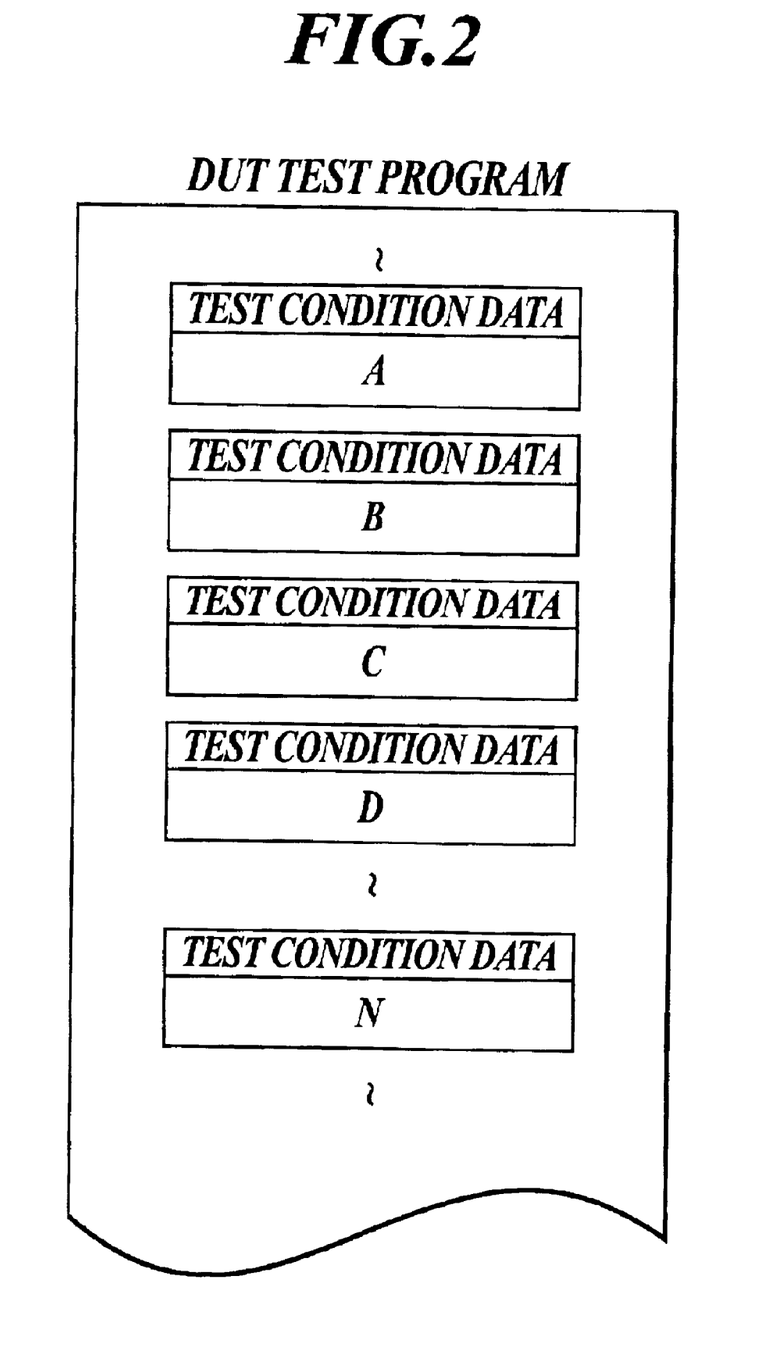
FIG. 2 shows an example of the program for the analog/digital characteristics test.

As shown in FIG. 2, n test condition data "A", "B", "C", "D", . . . , "N" corresponding to the n analog/digital characteristics measurement circuits 61 to 6n, are programmed in the test program for the DUT.

The decoder 2 inputs a data outputted from the test controller 1. By decoding the inputted data, the decoder 2 detects that the test condition data is transmitted to each analog/digital characteristics measurement circuit 6.

The counter 3 inputs the output signal of the decoder 2 to count the number of times that the test condition data is transmitted.

The clock distribution circuit 4 distributes the data write clock signal outputted from the test controller 1, in accordance with the output signal (counter value) of the counter 3. In the first embodiment, when the counter value is "1" of the counter 3, the data write clock signals CLK1 to CLKn are supplied to all of the analog/digital characteristics measurement circuits 61 to 6n. When the counter value is "n" of the counter 3, the data write clock signal CLKn is supplied to the nth analog/digital characteristics measurement circuit 6n.

The analog/digital characteristics measurement circuit 6 comprises a computing circuit 6a, a memory 6b, a voltage measurement circuit 6c and a voltage generating circuit 6d.

The test condition data outputted from the test controller 1 is stored in a register of the computing circuit 6a and the memory 6b by synchronizing with the clock signal outputted from the clock distribution circuit 4. The test condition data outputted from the test controller 1 is written in the n analog/digital characteristics measurement circuits 62, 63, 64, . . . , 6n having the same structure and function as the analog/digital characteristics measurement circuit 6, in accordance with each clock signal outputted from the clock distribution circuit 4.

A measurement algorithm for carrying out the analog/digital characteristics measurement is previously stored in the memory 6b. In accordance with the measurement algorithm and the test condition data, the computing circuit 6a controls the voltage measurement circuit 6c and the voltage generating circuit 6d.

For example, when a test for an analog-to-digital converter provided in the DUT is carried out, the computing circuit 6a controls the voltage generating circuit 6d to apply an analog signal to the DUT. The analog-to-digital converter of the DUT outputs a digital signal corresponding to the applied analog signal. The computing circuit 6a stores the digital signal in the memory 6b. The computing circuit 6a controls the voltage generating circuit 6d to change an analog signal to be applied and collects the necessary data for analog/digital characteristics measurement. When the necessary data is collected, the computing circuit 6a computes a data to judge whether the DUT is good or poor in accordance with the test condition data. The computing circuit 6a outputs the above judgment as a test result.

When a test for a digital-to-analog converter provided in the DUT is carried out, the computing circuit 6a applies a digital signal to the DUT. The digital-to-analog converter of the DUT outputs an analog signal corresponding to the applied digital signal. The outputted analog signal is measured by the voltage measurement circuit 6c. The computing circuit 6a stores the above measurement result in the memory 6b. The computing circuit 6a changes a digital signal to be applied and collects the necessary data for analog/digital characteristics measurement. When the necessary data is collected, the computing circuit 6a computes a data to judge whether the DUT is good or poor in accordance with the test condition data. The computing circuit 6a outputs the above judgment as a test result.

Each test result "a", "b", "c", "d", . . . , "n" outputted from each analog/digital characteristics measurement circuit 6 is inputted into the multiplexer 5.

The multiplexer 5 comprises n input terminals and n output terminals. The test result data outputted from the nth analog/digital characteristics measurement circuit 6n is inputted into the nth input terminal. The multiplexer 5 multiplexes the inputted test result data in order for the test controller 1 to easily manage the test result data, in accordance with the output signal (counter value) of the counter 3, and outputs the test result data to the test controller 1. The test controller 1 manages the test result data outputted from the multiplexer 5. Thereby, in case that the analog/digital characteristics test is carried out for one DUT a plurality of times by using a plurality of test conditions, the test controller 1 calculates the final test result for judging whether the DUT is good or poor.

The operation of the analog/digital characteristics testing device 100 will be explained.

In the analog/digital characteristics testing device 100 shown in FIG. 1, the number of the analog/digital characteristics measurement circuits 6 is n which is an optional natural number. The operation of assigning the n analog/digital characteristics measurement circuits 6 to one DUT will be explained with reference to FIGS. 3 and 4.

Figure 3:
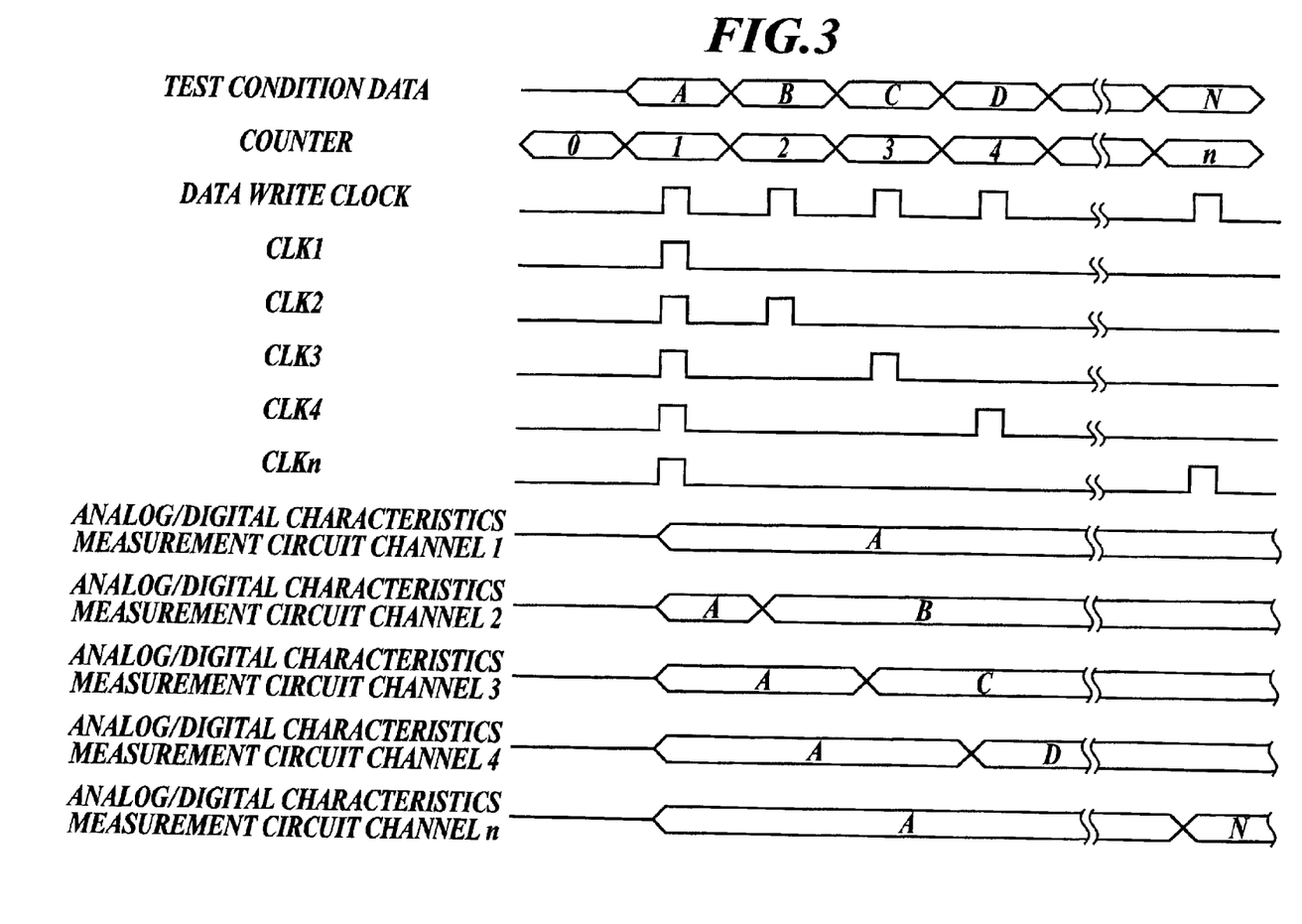
FIG. 3 shows a timing chart for explaining the timing that the test condition data is written in each analog/digital characteristics measurement circuit.
Figure 4:
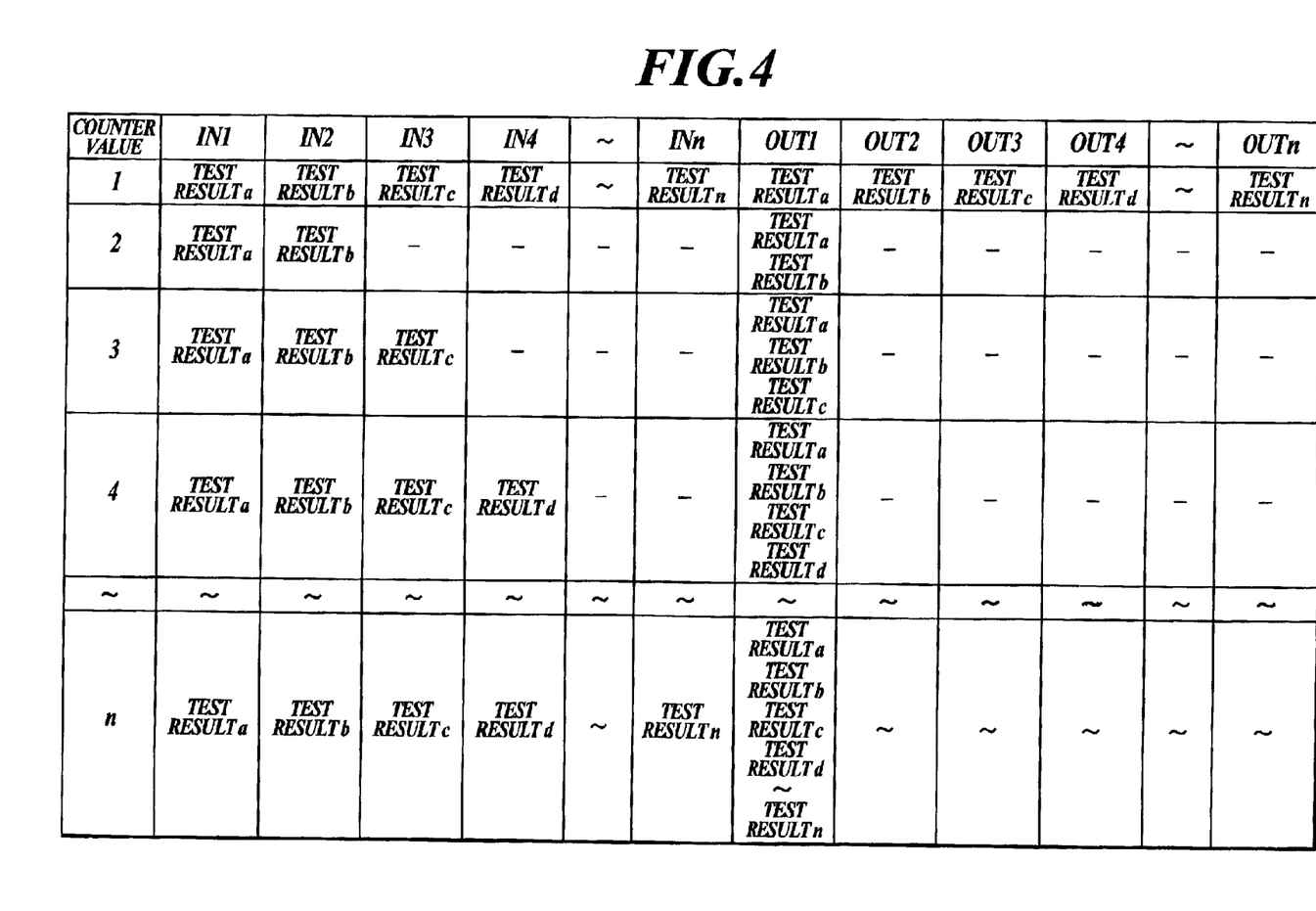
FIG. 4 shows the relation between the inputted test result data and the outputted test result data, for each terminal of the multiplexer.

FIG. 3 shows a timing chart for explaining the timing that the test condition data is written in each analog/digital characteristics measurement circuit 61 to 6n. FIG. 4 shows the relation between the inputted test result data and the outputted test result data, for each terminal of the multiplexer 5.

The case of testing a plurality of analog-to-digital converters or a plurality of digital-to-analog converters, which are provided in one DUT will be explained.

During the characteristics test of the DUT, as shown in FIG. 3, the n test condition data are transmitted from the test controller 1 in order of "A" to "N". The decoder 2 detects that the transmitted test condition data are ones for the analog/digital characteristics test. The number of the detected test condition data is counted by the counter 3.

The clock distribution circuit 4 distributes the data write clock signal transmitted from the test controller 1, to each analog/digital characteristics measurement circuit 61 to 6n in accordance with the counter value of the counter 3. That is, as shown in FIG. 3, when the output signal (counter value) of the counter 3 is "1", the clock signals CLK1, CLK2, CLK3, CLK4, . . . , CLKn are generated at the timing of the inputted data write clock signal to output them to all of the analog/digital characteristics measurement circuits 61, 62, 63, 64, . . . , 6n.

When the counter value of the counter 3 is "2", the clock signal CLK2 is generated at the timing of the data write clock signal to output it to the second analog/digital characteristics measurement circuit 62. Similarly, when the output signal (counter value) of the counter 3 is "n", the clock signal CLKn is generated at the timing of the data write clock signal to output it to the nth analog/digital characteristics measurement circuit 6n.

Each analog/digital characteristics measurement circuit 6 writes the test condition data in a register of the computing circuit 6a or in the memory 6b in accordance with the clock signals CLK1 to CLKn outputted from the clock distribution circuit 4.

By the above test condition writing operation, when the test condition data is only one ("A"), the same test condition data is simultaneously set to all of the analog/digital characteristics measurement circuits 6. As a result, the test that n DUTs are simultaneously measured by using n analog/digital characteristics measurement circuits like the analog/digital characteristics testing device 300, can be carried out. In case that the number of the test condition data is n, the test condition data are set to n analog/digital characteristics measurement circuits 6, respectively. As a result, n circuits to be tested for the analog/digital characteristics, which have different characteristics from each other and which are provided in one DUT, can be simultaneously tested.

Next, the test result data will be explained.

The test result data outputted from the analog/digital characteristics measurement circuits 61 to 6n are inputted into the multiplexer 5. The multiplexer 5 multiplexes the inputted test result data in accordance with the output signal (counter value) of the counter 3 as shown in FIG. 4.

When the output signal (counter value) of the counter 3 is "1", the test result data "a" to "n" outputted from the analog/digital characteristics measurement circuits 61 to 6n are inputted into the input terminals IN1 to INn of the multiplexer 5, respectively. The test result data are outputted from the output terminals OUT1 to OUTn corresponding to the input terminals IN1 to INn.

When the output signal (counter value) of the counter 3 is "2", the test result data "a" outputted from the first analog/digital characteristics measurement circuit 61 is inputted into the input terminal IN1 of the multiplexer 5. Further, the test result data "b" outputted from the second analog/digital characteristics measurement circuit 62 is inputted into the input terminal IN2. In order for the test controller 1 to easily manage the test result data, the multiplexer 5 operates an AND operation of the inputted test result data "a" and "b" to output the AND operation to the first output terminal OUT1.

Similarly, when the output signal of the counter 3 is "n", the test result data "a" to "n" outputted from the first to nth analog/digital characteristics measurement circuits 61 to 6n are inputted into the input terminals IN1 to INn of the multiplexer 5, respectively. In order for the test controller 1 to easily manage the test result data, the multiplexer 5 operates an AND operation of the inputted test result data "a" to "n" to output the AND operation to the first output terminal OUT1.

The signal outputted from the multiplexer 5 is managed as a test result data by the test controller 1.

The test controller 1 judges whether the DUT is good or poor in accordance with all of the test result data outputted from the multiplexer 5 and outputs the judgment as an analog/digital characteristics test result of the DUT.

As described above, according to the analog/digital characteristics testing device 100 of the first embodiment, a plurality of different test condition data "A" to "N" are outputted from the test controller 1 in order. The number of the outputted test condition data is counted by the counter 3. The data write clock signal outputted from the test controller 1 is distributed by the clock distribution circuit 4 in accordance with the counter value of the counter 3, that is, the order of the test condition data. Then, the corresponding test condition data are written in each analog/digital characteristics measurement circuit 6.

Therefore, because a plurality of different test condition data can be set to each analog/digital characteristics measurement circuit 61 to 6n, a plurality of circuits to be tested for the analog/digital characteristics, which have different characteristics from each other, and which are provided in one DUT, can be simultaneously tested under different test conditions. The efficiency of the test can be improved. Further, because the analog/digital characteristics measurement circuit requiring high precious and precise parts is not required to be further added and the analog/digital characteristics testing device can be realized by adding only cheap logic ICs, for example, a decoder, a counter, a clock distribution circuit, a multiplexer or the like, the manufacturing cost of the analog/digital characteristics testing device 100 can be reduced.

When the counter value of the counter is "1", one test condition data is written in all of the analog/digital characteristics measurement circuits 61 to 6n. Further, the test result data of each analog/digital characteristics measurement circuit 61 to 6n is inputted into the multiplexer 5. Therefore, it is also possible to set the same test condition data to all of the analog/digital characteristics measurement circuits 61 to 6n and to simultaneously test a plurality of DUTs.

The test result data of each analog/digital characteristics measurement circuit 61 to 6n is inputted into the multiplexer 5. The multiplexer 5 operates an AND operation of the inputted test result data in accordance with the counter value of the counter 3 and outputs the AND operation to the test controller l from a predetermined terminal. The test controller 1 manages the signal outputted from the multiplexer 5 as a test result data. For example, it is judged whether the DUT is good or poor in accordance with the test result data obtained by testing the analog/digital characteristics a plurality of times under a plurality of different test conditions. Then, the above judgment is outputted. Therefore, a test operator can test the characteristics efficiently and easily obtain the test result.

Second Embodiment:

Next, the analog/digital characteristics testing device 200 will be explained as a second embodiment.

Figure 5:
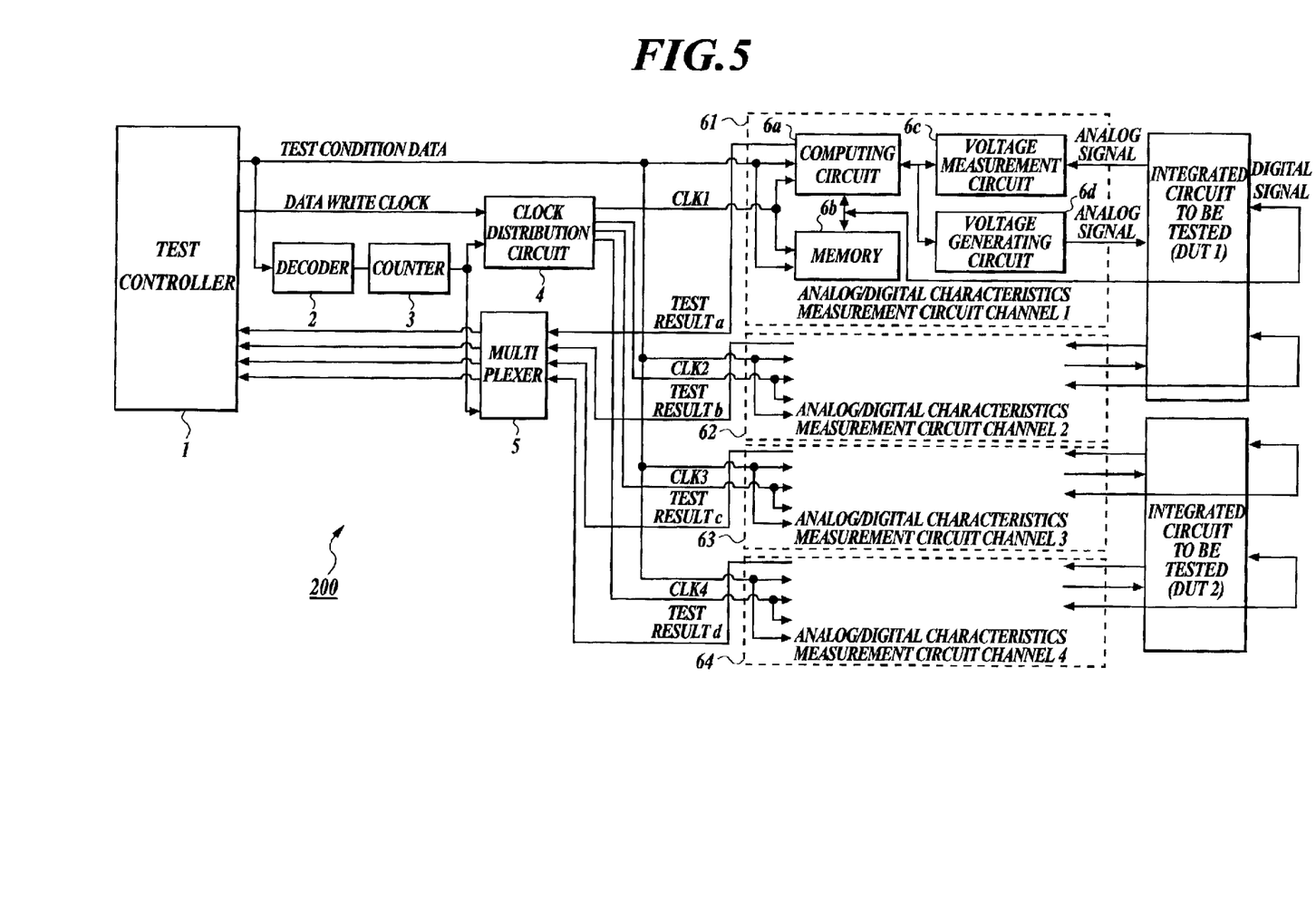
FIG. 5 shows a block diagram of the analog/digital characteristics testing device according to the second embodiment.
Figure 6:
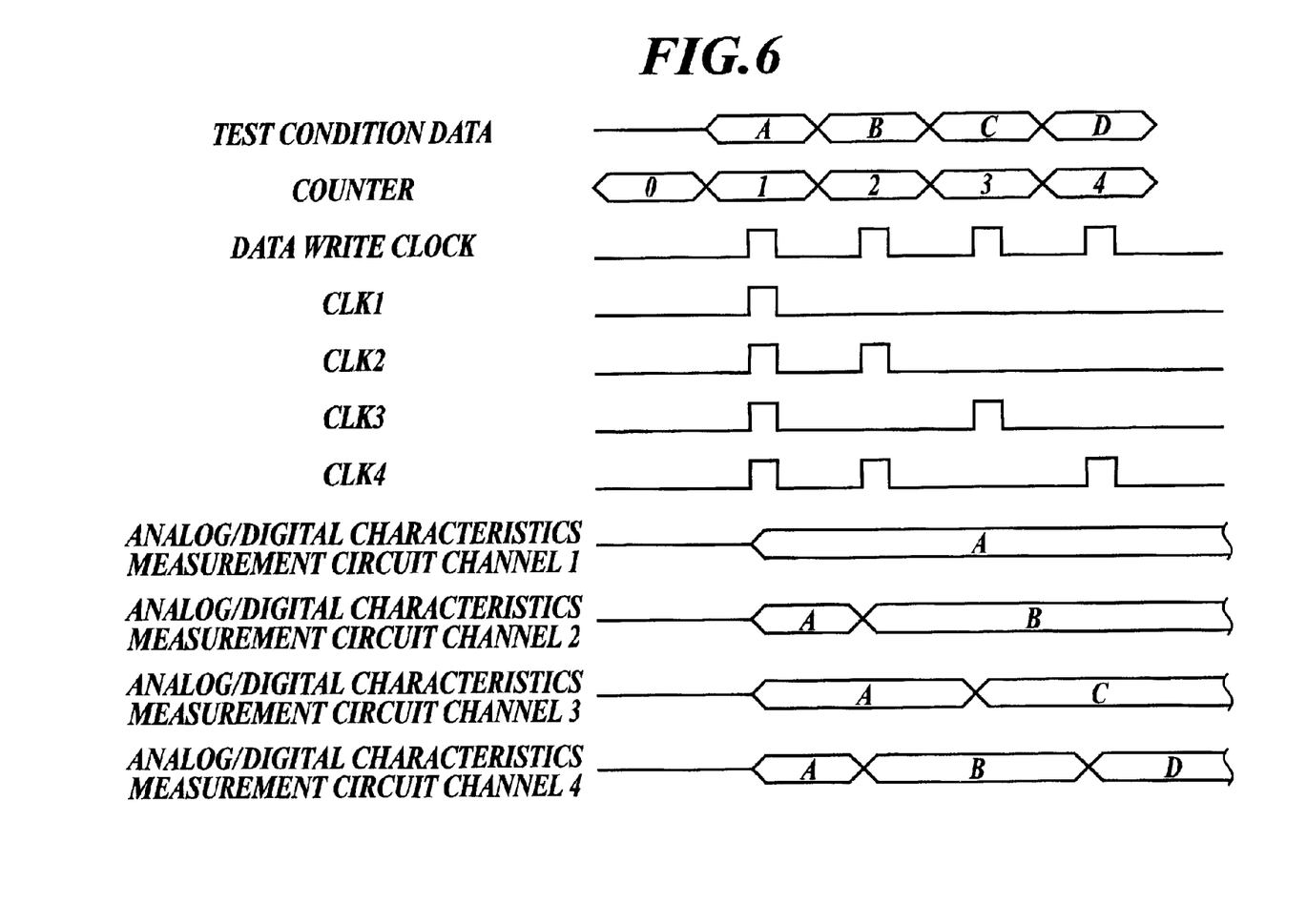
FIG. 6 shows a timing chart for explaining the timing that the test condition data is written in each analog/digital characteristics measurement circuit.
Figure 7:
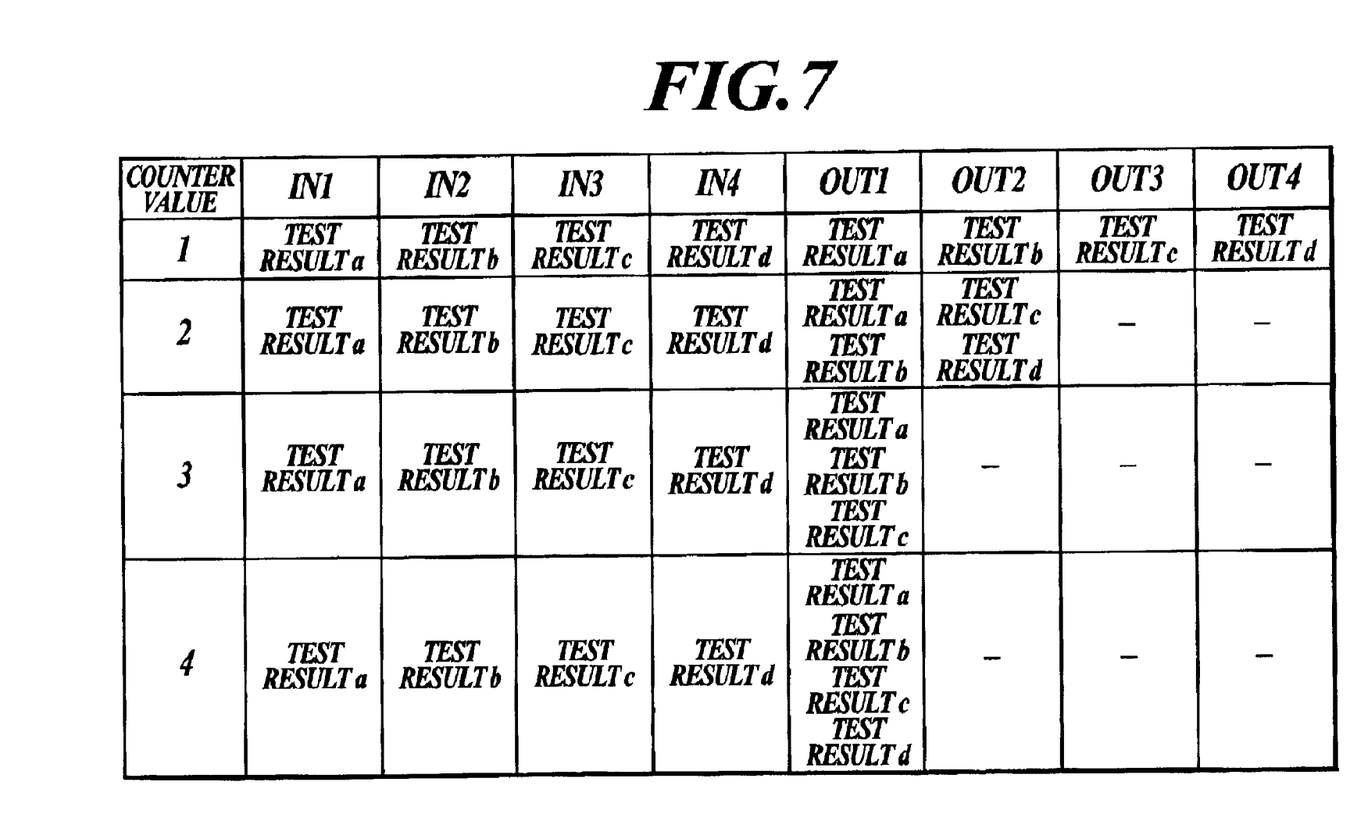
FIG. 7 shows the relation between the inputted test result data and the outputted test result data, for each terminal of the multiplexer.

FIG. 5 shows a block diagram of the analog/digital characteristics testing device 200. The structure for testing two DUTs (DUT1 and DUT2) by using four analog/digital characteristics measurement circuits 6, is shown in the drawing as an example. FIG. 6 shows a timing chart for explaining the timing that each test condition data is written in each analog/digital characteristics measurement circuit 6. FIG. 7 shows the relation between the inputted test result data and the outputted test result data, for each terminal of the multiplexer 5.

As shown in FIG. 5, the analog/digital characteristics testing device 200 has almost the same structure as the analog/digital characteristics testing device 100 according to the first embodiment. Therefore, the detailed explanation for each element is omitted. The same reference numeral is attached to the same element as the first embodiment.

In the second embodiment, when the counter value of the counter 3 is "1", the clock distribution circuit 4 outputs the clock signals CLK1 to CLK4 to the analog/digital characteristics measurement circuits 6 respectively, to set the same test condition data "A" to all of the analog/digital characteristics measurement circuits 6. When the counter value of the counter 3 is "2", the clock distribution circuit 4 outputs the clock signal CLK2 and CLK4 to the analog/digital characteristics measurement circuits 62 and 64 respectively, to set the test condition data "B" to the analog/digital characteristics measurement circuits 62 and 64. When the counter value of the counter 3 is "3", the clock distribution circuit 4 outputs the clock signal CLK3 to the analog/digital characteristics measurement circuit 63 to set the test condition data "C" to the analog/digital characteristics measurement circuit 63. When the counter value of the counter 3 is "4", the clock distribution circuit 4 outputs the clock signal CLK4 to the analog/digital characteristics measurement circuit 64 to set the test condition data "D" to the analog/digital characteristics measurement circuit 64.

With reference to FIGS. 6 and 7, the operation of the second embodiment will be explained.

FIG. 6 shows the timing chart for explaining the timing that each test condition data is written in each analog/digital characteristics measurement circuit 61 to 64. FIG. 7 shows the relation between the inputted test result data and the outputted test result data, for each terminal of the multiplexer 5.

The operation that two analog-to-digital converters or two digital-to-analog converters which are incorporated into each DUT1 and DUT2 are tested, will be explained.

During the characteristics test of the DUT, as shown in FIG. 6, four test condition data are transmitted from the test controller 1 in the order of "A" to "D". The decoder 2 detects that the transmitted test condition data are ones for the analog/digital characteristics test. The number of the detected test condition data is counted by the counter 3.

The clock distribution circuit 4 distributes the data write clock signal transmitted from the test controller 1, to each analog/digital characteristics measurement circuit 61 to 64 in accordance with the counter value of the counter 3. That is, as shown in FIG. 6, when the output signal (counter value) of the counter 3 is "1", the clock signals CLK1, CLK2, CLK3 and CLK4 are generated at the timing of the inputted data write clock signal and are outputted to the analog/digital characteristics measurement circuits 61 to 64, respectively.

When the counter value of the counter 3 is "2", the clock signals CLK2 and CLK4 are generated at the timing of the data write clock signal and are outputted to the second analog/digital characteristics measurement circuit 62 and the fourth analog/digital characteristics measurement circuit 64, respectively.

When the counter value of the counter 3 is "3", the clock signal CLK3 is generated at the timing of the data write clock signal and is outputted to the third analog/digital characteristics measurement circuit 63.

When the counter value of the counter 3 is "4", the clock signal CLK4 is generated at the timing of the data write clock signal and is outputted to the fourth analog/digital characteristics measurement circuit 64.

Each analog/digital characteristics measurement circuit 61 to 64 writes the test condition data outputted from the test controller 1 at the timing of each clock signal CLK1 to CLK4, in a register of the computing circuit 6a or the memory 6b at the timing of each clock signal CLK1 to CLK4 outputted from the clock distribution circuit 4.

By the above test condition writing operation, when the test condition data is only one ("A"), the same test condition data is simultaneously set to all of the analog/digital characteristics measurement circuits 61 to 64. When the test condition data are two or more, the second test condition data "B" is set to the analog/digital characteristics measurement circuits 62 and 64. The third test condition data "C" is set to the analog/digital characteristics measurement circuit 63. The fourth test condition data "D" is set to the analog/digital characteristics measurement circuit 64.

That is, when the test condition data is transmitted from the test controller 1 only once, the same test condition data "A" is set to the first to fourth analog/digital characteristics measurement circuits 61, 62, 63 and 64. By measuring the DUTs corresponding to each analog/digital characteristics measurement circuit 61 to 64, two DUTs having the same functions can be simultaneously measured.

When the test condition data is transmitted twice, the test condition data "A" is set to the first analog/digital characteristics measurement circuit 61 and the third analog/digital characteristics measurement circuit 63. The test condition data "B" is set to the second analog/digital characteristics measurement circuit 62 and the fourth analog/digital characteristics measurement circuit 64. Therefore, two circuits to be tested for the analog/digital characteristics, which are provided in the DUT1, can be simultaneously measured by the analog/digital characteristics measurement circuits 61 and 62. Further, two circuits to be tested for the analog/digital characteristics, which are provided in the DUT2 having the same function as the DUT1, can be simultaneously measured by the analog/digital characteristics measurement circuits 63 and 64 under the same conditions as the DUT1.

When the test condition data is transmitted three times or four times, different test condition data can be set to the analog/digital characteristics measurement circuits 61, 62 and 63, or to the analog/digital characteristics measurement circuits 61, 62, 63 and 64. Therefore, three or four circuits to be tested for the analog/digital characteristics, which are provided in one DUT, can be simultaneously measured.

Next, the test result data will be explained.

The test result data outputted from the analog/digital characteristics measurement circuits 61 to 64 are inputted into the multiplexer 5. The multiplexer 5 multiplexes the inputted test result data in accordance with the output signal (counter value) of the counter 3 as shown in FIG. 7.

When the output signal (counter value) of the counter 3 is "1", the test result data "a" to "d" outputted from the analog/digital characteristics measurement circuits 61 to 64 are inputted into the input terminals IN1 to IN4 of the multiplexer 5, respectively. The test result data are outputted from the output terminals OUT1 to OUT4 corresponding to the input terminals IN1 to IN4.

When the output signal (counter value) of the counter 3 is "2", the multiplexer 5 operates an AND operation of the test result data "a" outputted from the first analog/digital characteristics measurement circuit 61 and the test result data "b" outputted from the second analog/digital characteristics measurement circuit 62, and outputs the AND operation to the first output terminal OUT1. Further, the multiplexer 5 operates an AND operation of the test result data "c" outputted from the third analog/digital characteristics measurement circuit 63 and the test result data "d" outputted from the fourth analog/digital characteristics measurement circuit 64, and outputs the AND operation to the second output terminal OUT2.

When the output signal (counter value) of the counter 3 is "3", the multiplexer 5 operates an AND operation of the test result data "a", "b" and "c" outputted from the first to third analog/digital characteristics measurement circuits 61, 62 and 63, and outputs the AND operation to the first output terminal OUT1. When the output signal (counter value) of the counter 3 is "4", the multiplexer 5 operates an AND operation of the test result data "a", "b", "c" and "d" outputted from the first to fourth analog/digital characteristics measurement circuits 61, 62, 63 and 64, and outputs the AND operation to the first output terminal OUT1.

The output signals outputted from the first to fourth output terminals OUT1 to OUT4 of the multiplexer 5 are managed as a test result data by the test controller 1.

The test controller 1 judges whether the DUT is good or poor in accordance with all of the test result data outputted from the multiplexer 5 and outputs the judgment as an analog/digital characteristics test result of the DUT.

As described above, in the second embodiment, the clock distribution circuit 4 specifies the analog/digital characteristics measurement circuit in which the test condition data is written, in accordance with the counter value of the counter 3. Further, the clock distribution circuit 4 sets the test condition data for simultaneously testing a plurality of the same DUTs having a plurality of circuits to be tested for the analog/digital characteristics. That is, in accordance with the counter value of the counter 3, a clock signal to be outputted is set.

Because the same test condition data or different test condition data are flexibly set to each analog/digital characteristics measurement circuit 6, it is possible that, for example, a plurality of DUTs having the same function and comprising a plurality of circuits to be tested for the analog/digital characteristics are simultaneously tested. Therefore, the efficiency of the test can be improved.

Further, the analog/digital characteristics testing device according to the present invention may be incorporated into an IC testing apparatus. Thereby, the IC testing apparatus having a function of testing the analog/digital characteristic of one or more ICs to be tested, can be provided.

The method for determining a test condition data to be set and an analog/digital characteristics measurement circuit to which the test condition data is set, is not limited to the above embodiments. An operator may register the test condition setting program to the test controller 1 in accordance with the number of the DUTs or the number of the circuits to be tested for the analog/digital characteristics, which are provided in the DUT. Then, the test controller 1 may control the clock distribution circuit 4 in accordance with the test condition setting program in order to write the test condition data in the corresponding analog/digital characteristics measurement circuit. Any other concrete test condition or the like can be optionally set. Further, the method for judging the test result inputted into the test controller and for outputting the test result, may be changed without departing the gist of the present invention.

According to the present invention, because the analog/digital characteristic of an IC to be tested can be tested by setting different test condition data to a plurality of measurement circuits with the setting unit, the efficient of the test is improved. For example, even though the circuits to be tested, such as a plurality of analog-to-digital converters, a plurality of digital-to-analog converters or the like, are provided in one IC to be tested, the analog/digital characteristic test can be carried out by setting different test condition data to each circuit to be tested.

The number of the test condition data outputted in order is counted by the test condition outputting circuit, the counting circuit and the specifying circuit. Therefore, the test condition data to be set and the measurement circuit in which the test condition data is written, can be specified in accordance with the counter value, that is, the output order.

When the test condition data is one, a plurality of ICs to be tested can be simultaneously tested by setting the same test condition data to all of the measurement circuits.

The result of the analog/digital characteristic test can be easily managed by the managing unit.

Because it can be judged whether the IC to be tested is good or poor by the multiplexing circuit and the judging circuit in accordance with the test result data outputted from each measurement circuit, a test operator can easily obtain the test result data under various test conditions.

The entire disclosure of Japanese Patent Application No. Tokugan 2000-324216 filed on Oct. 24, 2000 including specification, claims drawings and summary are incorporated herein by reference in its entirety.

What is claimed is:

1. An analog/digital characteristics testing device comprising:
    a plurality of measurement circuits for measuring an analog/digital characteristic of one or more ICs to be tested in accordance with a test condition data; and
    a setting unit for setting a different test condition data to each measurement circuits; and
    wherein the setting unit comprises:
    a test condition outputting circuit for outputting the test condition data in order;
    a counting circuit for counting the number of the test condition data outputted from the test condition outputting circuit; and
    a specifying circuit for specifying the measurement circuit in which the test condition data is written, in accordance with a counter value of the counting circuit; and
    when an initial test condition data is outputted from the test condition outputting circuit, the specifying circuit specifies all of the measurement circuits as a circuit in which the initial test condition data is written, and
    when a counter value counted by the counting circuit is equivalent to the number of the measurement circuit, the specifying circuit specifies the measurement circuits where the test condition data written to each measurement circuit is different from one another, at a point when the test condition outputting circuit finishes outputting the test condition data.

2. The analog/digital characteristics testing device as claimed in claim 1, further comprising a management unit for managing a test result data obtained by each measurement circuit.

3. The analog/digital characteristics testing device as claimed in claim 2, wherein the setting unit comprises:
    a test condition outputting circuit for outputting the test condition data in order; and
    a counting circuit for counting the number of the test condition data outputted from the test condition outputting circuit; and wherein
    the management unit comprises:
    a multiplexing circuit for outputting the test result data obtained by each measurement circuit, from a predetermined output terminal in accordance with the counter value of the counting circuit; and
    a judging circuit for judging whether the one or more ICs to be tested are good or poor in accordance with the test result data outputted from the multiplexing circuit; and
    when the counter value is 1, the multiplexing circuit outputs the test result data respectively from the predetermined output terminals, and when the counter value is equivalent to the number of the measurement circuits, the multiplexing circuit operates an AND operation of the test result data and outputs a computed result obtained by the AND operation from the undetermined output terminal.

4. An IC testing apparatus comprising:
    an analog/digital characteristics testing device comprising:
    a plurality of measurement circuits for measuring an analog/digital characteristic of one or more ICs to be tested in accordance with a test condition data; and
    a setting unit for setting a different test condition data to each measurement circuit; and
    wherein the setting unit comprises:
    a test condition outputting circuit for outputting the test condition data in order;
    a counting circuit for counting the number of the test condition data outputted from the test condition outputting circuit; and
    a specifying circuit for specifying the measurement circuit in which the test condition data is written, in accordance with a counter value of the counting circuit; and
    when an initial test condition data is outputted from the test condition outputting circuit, the specifying circuit specifies all of the measurement circuits as a circuit in which the initial test condition data is written; and
    when a counter value counted by the counting circuit is equivalent to the number of the measurement circuit, the specifying circuit specifies the measurement circuits where the test condition data written to each measurement circuit is different from one another, at a point when the test condition outputting circuit finishes outputting the test condition data.

5. The IC testing apparatus as claimed in claim 4, wherein the analog/digital characteristics testing device further comprises a management unit for managing a test result data obtained by each measurement circuit.

6. The IC testing apparatus as claimed in claim 5, wherein the setting unit comprises:
    a test condition outputting circuit for outputting the test condition data in order; and
    a counting circuit for counting the number of the test condition data outputted from the test condition outputting circuit; and wherein
    the management unit comprises:
    a multiplexing circuit for outputting the test result data obtained by each measurement circuit, from a predetermined output terminal in accordance with the counter value of the counting circuit; and
    a judging circuit for judging whether the one or more ICs to be tested are good or poor in accordance with the test result data outputted from the multiplexing circuit; and wherein
    when the counter value is 1, the multiplexing circuit outputs the test result data respectively from the predetermined output terminals, and when the counter value is equivalent to the number of the measurement circuits, the multiplexing circuit operates an AND operation of the test result data and outputs a computed result obtained by the AND operation from the predetermined output terminal.

* * * * *